US008756485B1

(12) United States Patent
Gee

(10) Patent No.: US 8,756,485 B1
(45) Date of Patent: Jun. 17, 2014

(54) PROGRAMMABLE GRAY CODE BIT CHANGE GENERATOR

(75) Inventor: Ralph Leonard Gee, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 107 days.

(21) Appl. No.: 13/444,188

(22) Filed: Apr. 11, 2012

Related U.S. Application Data

(60) Provisional application No. 61/475,591, filed on Apr. 14, 2011.

(51) Int. Cl.
*G06F 11/10* (2006.01)
*H03M 13/00* (2006.01)

(52) U.S. Cl.
USPC .......................................... 714/807

(58) Field of Classification Search
USPC ......................................... 714/807
See application file for complete search history.

(56) References Cited

U.S. PATENT DOCUMENTS

| 6,304,398 | B1 * | 10/2001 | Gaub et al. ...................... 360/49 |
| 7,050,249 | B1 * | 5/2006 | Chue et al. ....................... 360/49 |
| 2002/0044077 | A1 * | 4/2002 | Tsukamoto ................... 341/160 |
| 2007/0160163 | A1 * | 7/2007 | Majima ......................... 375/295 |
| 2007/0168779 | A1 * | 7/2007 | Regev et al. .................. 714/718 |
| 2011/0213944 | A1 * | 9/2011 | Guarnaccia et al. .......... 711/167 |

* cited by examiner

*Primary Examiner* — Guerrier Merant
(74) *Attorney, Agent, or Firm* — Van Pelt, Yi & James LLP

(57) ABSTRACT

Processing a received signal includes receiving a code word that is different from an expected code word, determining, at least in part using a logic circuit, whether the difference between the received code word and the expected code word is acceptable based at least in part on one or more bit differences, and in the event it is determined that the difference is unacceptable, providing an indication of an error.

20 Claims, 15 Drawing Sheets

| Binary Code | | | | | Gray Code | | | |
|---|---|---|---|---|---|---|---|---|
| Bit3 | Bit2 | Bit1 | Bit0 | | Bit3 | Bit2 | Bit1 | Bit0 |
| 0 | 0 | 0 | 0 | | 0 | 0 | 0 | 0 |
| 0 | 0 | 0 | 1 | | 0 | 0 | 0 | 1 |
| 0 | 0 | 1 | 0 | | 0 | 0 | 1 | 1 |
| 0 | 0 | 1 | 1 | | 0 | 0 | 1 | 0 |
| 0 | 1 | 0 | 0 | | 0 | 1 | 1 | 0 |
| 0 | 1 | 0 | 1 | | 0 | 1 | 1 | 1 |
| 0 | 1 | 1 | 0 | | 0 | 1 | 0 | 1 |
| 0 | 1 | 1 | 1 | | 0 | 1 | 0 | 0 |
| 1 | 0 | 0 | 0 | | 1 | 1 | 0 | 0 |
| 1 | 0 | 0 | 1 | | 1 | 1 | 0 | 1 |
| 1 | 0 | 1 | 0 | | 1 | 1 | 1 | 1 |
| 1 | 0 | 1 | 1 | | 1 | 1 | 1 | 0 |
| 1 | 1 | 0 | 0 | | 1 | 0 | 1 | 0 |
| 1 | 1 | 0 | 1 | | 1 | 0 | 1 | 1 |
| 1 | 1 | 1 | 0 | | 1 | 0 | 0 | 1 |
| 1 | 1 | 1 | 1 | | 1 | 0 | 0 | 0 |

| Binary | Gray | Non-saturated | Saturated |
|---|---|---|---|
| 0 0 0 0 | 0 0 0 0 0 | 0 0 0 0 1 | 0 0 0 0 1 |
| 0 0 0 1 | 0 0 0 0 1 | 0 0 0 1 0 | 0 0 0 1 0 |
| 0 0 1 0 | 0 0 0 1 1 | 0 0 0 0 1 | 0 0 0 0 1 |
| 0 0 1 1 | 0 0 0 1 0 | 0 0 1 0 0 | 0 0 1 0 0 |
| 0 1 0 0 | 0 0 1 1 0 | 0 0 0 0 1 | 0 0 0 0 1 |
| 0 1 0 1 | 0 0 1 1 1 | 0 0 0 1 0 | 0 0 0 1 0 |
| 0 1 1 0 | 0 0 1 0 1 | 0 0 0 0 1 | 0 0 0 0 1 |
| 0 1 1 1 | 0 0 1 0 0 | 0 1 0 0 0 | 0 1 0 0 0 |
| 1 0 0 0 | 0 1 1 0 0 | 0 0 0 0 1 | 0 0 0 0 1 |
| 1 0 0 1 | 0 1 1 0 1 | 0 0 0 1 0 | 0 0 0 1 0 |
| 1 0 1 0 | 0 1 1 1 1 | 0 0 0 0 1 | 0 0 0 0 1 |
| 1 0 1 1 | 0 1 1 1 0 | 0 0 1 0 0 | 0 0 1 0 0 |
| 1 1 0 0 | 0 1 0 1 0 | 0 0 0 0 1 | 0 0 0 0 1 |
| 1 1 0 1 | 0 1 0 1 1 | 0 0 0 1 0 | 0 0 0 1 0 |
| 1 1 1 0 | 0 1 0 0 1 | 0 0 0 0 1 | 0 0 0 0 1 |
| 1 1 1 1 | 0 1 0 0 0 | 1 0 0 0 0 | 1 0 0 0 0 |
| 0 0 0 0 | 1 1 0 0 0 | 0 0 0 0 1 | 0 0 0 0 1 |
| 0 0 0 1 | 1 1 0 0 1 | 0 0 0 1 0 | 0 0 0 1 0 |
| 0 0 1 0 | 1 1 0 1 1 | 0 0 0 0 1 | 0 0 0 0 1 |
| 0 0 1 1 | 1 1 0 1 0 | 0 0 1 0 0 | 0 0 1 0 0 |
| 0 1 0 0 | 1 1 1 1 0 | 0 0 0 0 1 | 0 0 0 0 1 |
| 0 1 0 1 | 1 1 1 1 1 | 0 0 0 1 0 | 0 0 0 1 0 |
| 0 1 1 0 | 1 1 1 0 1 | 0 0 0 0 1 | 0 0 0 0 1 |
| 0 1 1 1 | 1 1 1 0 0 | 0 1 0 0 0 | 0 1 0 0 0 |
| 1 0 0 0 | 1 0 1 0 0 | 0 0 0 0 1 | 0 0 0 0 1 |
| 1 0 0 1 | 1 0 1 0 1 | 0 0 0 1 0 | 0 0 0 1 0 |
| 1 0 1 0 | 1 0 1 1 1 | 0 0 0 0 1 | 0 0 0 0 1 |
| 1 0 1 1 | 1 0 1 1 0 | 0 0 1 0 0 | 0 0 1 0 0 |
| 1 1 0 0 | 1 0 0 1 0 | 0 0 0 0 1 | 0 0 0 0 1 |
| 1 1 0 1 | 1 0 0 1 1 | 0 0 0 1 0 | 0 0 0 1 0 |
| 1 1 1 0 | 1 0 0 0 1 | 0 0 0 0 1 | 0 0 0 0 1 |
| 1 1 1 1 | 1 0 0 0 0 | 1 0 0 0 0 | 0 0 0 0 0 |

| Binary | | | | Gray | | | | Non-saturated | | | | | Saturated | | | | |
|---|---|---|---|---|---|---|---|---|---|---|---|---|---|---|---|---|---|
| 0 | 0 | 0 | 0 | 0 | 0 | 0 | 0 | 0 | 0 | 0 | 1 | 1 | 0 | 0 | 0 | 1 | 1 |
| 0 | 0 | 0 | 1 | 0 | 0 | 0 | 1 | 0 | 0 | 0 | 1 | 1 | 0 | 0 | 0 | 1 | 1 |
| 0 | 0 | 1 | 0 | 0 | 0 | 1 | 1 | 0 | 0 | 1 | 0 | 1 | 0 | 0 | 1 | 0 | 1 |
| 0 | 0 | 1 | 1 | 0 | 0 | 1 | 0 | 0 | 0 | 1 | 0 | 1 | 0 | 0 | 1 | 0 | 1 |
| 0 | 1 | 0 | 0 | 0 | 1 | 1 | 0 | 0 | 0 | 0 | 1 | 1 | 0 | 0 | 0 | 1 | 1 |
| 0 | 1 | 0 | 1 | 0 | 1 | 1 | 1 | 0 | 0 | 0 | 1 | 1 | 0 | 0 | 0 | 1 | 1 |
| 0 | 1 | 1 | 0 | 0 | 1 | 0 | 1 | 0 | 1 | 0 | 0 | 1 | 0 | 1 | 0 | 0 | 1 |
| 0 | 1 | 1 | 1 | 0 | 1 | 0 | 0 | 0 | 1 | 0 | 0 | 1 | 0 | 1 | 0 | 0 | 1 |
| 1 | 0 | 0 | 0 | 1 | 1 | 0 | 0 | 0 | 0 | 0 | 1 | 1 | 0 | 0 | 0 | 1 | 1 |
| 1 | 0 | 0 | 1 | 1 | 1 | 0 | 1 | 0 | 0 | 0 | 1 | 1 | 0 | 0 | 0 | 1 | 1 |
| 1 | 0 | 1 | 0 | 1 | 1 | 1 | 1 | 0 | 0 | 1 | 0 | 1 | 0 | 0 | 1 | 0 | 1 |
| 1 | 0 | 1 | 1 | 1 | 1 | 1 | 0 | 0 | 0 | 1 | 0 | 1 | 0 | 0 | 1 | 0 | 1 |
| 1 | 1 | 0 | 0 | 1 | 0 | 1 | 0 | 0 | 0 | 0 | 1 | 1 | 0 | 0 | 0 | 1 | 1 |
| 1 | 1 | 0 | 1 | 1 | 0 | 1 | 1 | 0 | 0 | 0 | 1 | 1 | 0 | 0 | 0 | 1 | 1 |
| 1 | 1 | 1 | 0 | 1 | 0 | 0 | 1 | 1 | 0 | 0 | 0 | 1 | 1 | 0 | 0 | 0 | 1 |
| 1 | 1 | 1 | 1 | 1 | 0 | 0 | 0 | 1 | 0 | 0 | 0 | 1 | 1 | 0 | 0 | 0 | 1 |
| 0 | 0 | 0 | 0 | 1 | 1 | 0 | 0 | 0 | 0 | 0 | 1 | 1 | 0 | 0 | 0 | 1 | 1 |
| 0 | 0 | 0 | 1 | 1 | 1 | 0 | 0 | 0 | 0 | 0 | 1 | 1 | 0 | 0 | 0 | 1 | 1 |
| 0 | 0 | 1 | 0 | 1 | 1 | 0 | 1 | 1 | 0 | 0 | 1 | 0 | 1 | 0 | 0 | 1 | 0 | 1 |
| 0 | 0 | 1 | 1 | 1 | 1 | 0 | 1 | 0 | 0 | 0 | 1 | 0 | 1 | 0 | 0 | 1 | 0 | 1 |
| 0 | 1 | 0 | 0 | 1 | 1 | 1 | 1 | 0 | 0 | 0 | 0 | 1 | 1 | 0 | 0 | 0 | 1 | 1 |
| 0 | 1 | 0 | 1 | 1 | 1 | 1 | 1 | 1 | 0 | 0 | 0 | 1 | 1 | 0 | 0 | 0 | 1 | 1 |
| 0 | 1 | 1 | 0 | 1 | 1 | 1 | 0 | 1 | 0 | 1 | 0 | 0 | 1 | 0 | 1 | 0 | 0 | 1 |
| 0 | 1 | 1 | 1 | 1 | 1 | 1 | 0 | 0 | 0 | 1 | 0 | 0 | 1 | 0 | 1 | 0 | 0 | 1 |
| 1 | 0 | 0 | 0 | 1 | 0 | 1 | 0 | 0 | 0 | 0 | 0 | 1 | 1 | 0 | 0 | 0 | 1 | 1 |
| 1 | 0 | 0 | 1 | 1 | 0 | 1 | 0 | 1 | 0 | 0 | 0 | 1 | 1 | 0 | 0 | 0 | 1 | 1 |
| 1 | 0 | 1 | 0 | 1 | 0 | 1 | 1 | 1 | 0 | 0 | 1 | 0 | 1 | 0 | 0 | 1 | 0 | 1 |
| 1 | 0 | 1 | 1 | 1 | 0 | 1 | 1 | 0 | 0 | 0 | 1 | 0 | 1 | 0 | 0 | 1 | 0 | 1 |
| 1 | 1 | 0 | 0 | 1 | 0 | 0 | 1 | 0 | 0 | 0 | 0 | 1 | 1 | 0 | 0 | 0 | 1 | 1 |
| 1 | 1 | 0 | 1 | 1 | 0 | 0 | 1 | 1 | 0 | 0 | 0 | 1 | 1 | 0 | 0 | 0 | 1 | 1 |
| 1 | 1 | 1 | 0 | 1 | 0 | 0 | 0 | 1 | 1 | 0 | 0 | 0 | 1 | 0 | 0 | 0 | 0 | 1 |
| 1 | 1 | 1 | 1 | 1 | 0 | 0 | 0 | 0 | 1 | 0 | 0 | 0 | 1 | 0 | 0 | 0 | 0 | 0 |

| Binary | Gray | Non-saturated | Saturated |
|--------|------|---------------|-----------|
| 0 0 0 0 | 0 0 0 0 0 | 0 0 0 1 1 | 0 0 0 1 1 |
| 0 0 0 1 | 0 0 0 0 1 | 0 0 1 1 1 | 0 0 1 1 1 |
| 0 0 1 0 | 0 0 0 1 1 | 0 0 1 0 1 | 0 0 1 0 1 |
| 0 0 1 1 | 0 0 0 1 0 | 0 0 1 1 1 | 0 0 1 1 1 |
| 0 1 0 0 | 0 0 1 1 0 | 0 0 0 1 1 | 0 0 0 1 1 |
| 0 1 0 1 | 0 0 1 1 1 | 0 1 0 1 1 | 0 1 0 1 1 |
| 0 1 1 0 | 0 0 1 0 1 | 0 1 0 0 1 | 0 1 0 0 1 |
| 0 1 1 1 | 0 0 1 0 0 | 0 1 0 1 1 | 0 1 0 1 1 |
| 1 0 0 0 | 0 1 1 0 0 | 0 0 0 1 1 | 0 0 0 1 1 |
| 1 0 0 1 | 0 1 1 0 1 | 0 0 1 1 1 | 0 0 1 1 1 |
| 1 0 1 0 | 0 1 1 1 1 | 0 0 1 0 1 | 0 0 1 0 1 |
| 1 0 1 1 | 0 1 1 1 0 | 0 0 1 1 1 | 0 0 1 1 1 |
| 1 1 0 0 | 0 1 0 1 0 | 0 0 0 1 1 | 0 0 0 1 1 |
| 1 1 0 1 | 0 1 0 1 1 | 1 0 0 1 1 | 1 0 0 1 1 |
| 1 1 1 0 | 0 1 0 0 1 | 1 0 0 0 1 | 1 0 0 0 1 |
| 1 1 1 1 | 0 1 0 0 0 | 1 0 0 1 1 | 1 0 0 1 1 |
| 0 0 0 0 | 1 1 0 0 0 | 0 0 0 1 1 | 0 0 0 1 1 |
| 0 0 0 1 | 1 1 0 0 1 | 0 0 1 1 1 | 0 0 1 1 1 |
| 0 0 1 0 | 1 1 0 1 1 | 0 0 1 0 1 | 0 0 1 0 1 |
| 0 0 1 1 | 1 1 0 1 0 | 0 0 1 1 1 | 0 0 1 1 1 |
| 0 1 0 0 | 1 1 1 1 0 | 0 0 0 1 1 | 0 0 0 1 1 |
| 0 1 0 1 | 1 1 1 1 1 | 0 1 0 1 1 | 0 1 0 1 1 |
| 0 1 1 0 | 1 1 1 0 1 | 0 1 0 0 1 | 0 1 0 0 1 |
| 0 1 1 1 | 1 1 1 0 0 | 0 1 0 1 1 | 0 1 0 1 1 |
| 1 0 0 0 | 1 0 1 0 0 | 0 0 0 1 1 | 0 0 0 1 1 |
| 1 0 0 1 | 1 0 1 0 1 | 0 0 1 1 1 | 0 0 1 1 1 |
| 1 0 1 0 | 1 0 1 1 1 | 0 0 1 0 1 | 0 0 1 0 1 |
| 1 0 1 1 | 1 0 1 1 0 | 0 0 1 1 1 | 0 0 1 1 1 |
| 1 1 0 0 | 1 0 0 1 0 | 0 0 0 1 1 | 0 0 0 1 1 |
| 1 1 0 1 | 1 0 0 1 1 | 1 0 0 1 1 | 0 0 0 1 1 |
| 1 1 1 0 | 1 0 0 0 1 | 1 0 0 0 1 | 0 0 0 0 1 |
| 1 1 1 1 | 1 0 0 0 0 | 1 0 0 1 1 | 0 0 0 0 0 |

FIG. 9

Delta Gray 3 Constructed from Delta Gray 2 and Delta Gray 1

PROGRAMMABLE GRAY CODE BIT CHANGE GENERATOR

CROSS REFERENCE TO OTHER APPLICATIONS

This application claims priority to U.S. Provisional Patent Application No. 61/475,591 entitled PROGRAMMABLE GRAY CODE BIT CHANGE GENERATOR filed Apr. 14, 2011 which is incorporated herein by reference for all purposes.

BACKGROUND OF THE INVENTION

As the density of hard disk drives increases, the distance between tracks (or cylinders) decreases, increasing the likelihood of error. To help maintain the correct track positioning of the read/write head, a track ID is written periodically around the disk, e.g., every few degrees. If the read/write head is on track, the same track ID should be read as the disk rotates. If a different track ID is read, then it is possible that the position of the read/write head is off. However, it is also possible that the position of the read/write head is correct, but there is an error on the disk. Currently, it is difficult to determine whether the problem is the incorrect position of the read/write head or if there is an actual error on the disk, each of which requires different responses. As such, it would be desirable to have a technique that addresses this issue.

BRIEF DESCRIPTION OF THE DRAWINGS

Various embodiments of the invention are disclosed in the following detailed description and the accompanying drawings.

FIG. 1 is a table illustrating a mapping of a binary code to a Gray code for 4 bits.

FIG. 3 is a table illustrating which Gray code word bits change in going from code word N to code word N+1.

FIG. 6 is a table illustrating which Gray code word bits change in going from code word N to N+1 to N+2 (Delta Gray 2).

FIG. 9 is a table illustrating which Gray code word bits change in going from code word N to N+1 to N+2 to N+3 (Delta Gray 3).

DETAILED DESCRIPTION

Figure 2:
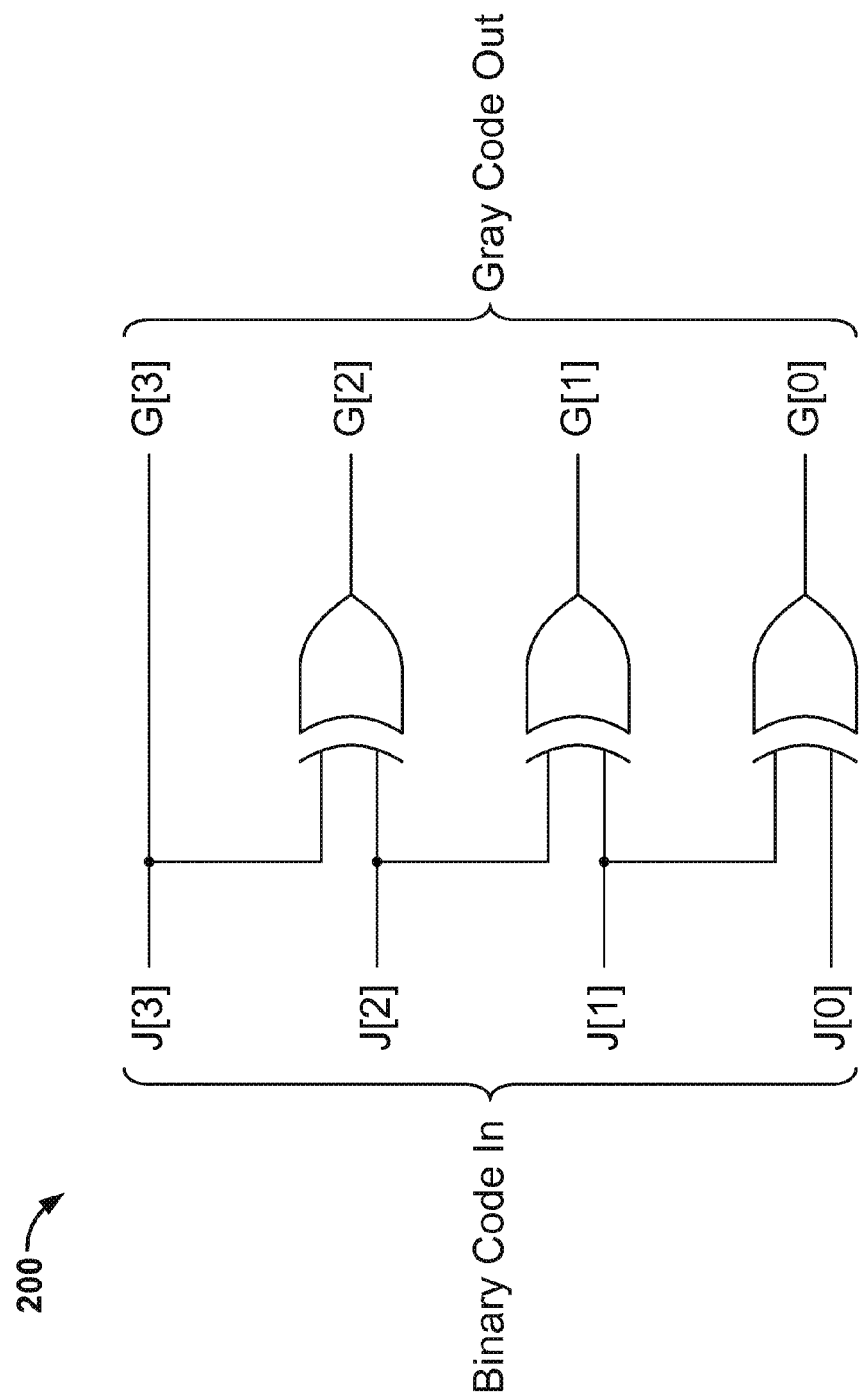
FIG. 2 illustrates the logic for a four bit Binary Code to Gray Code map.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a table illustrating a mapping of a binary code to a Gray code for 4 bits. A Gray Code is a code in which only one bit is changed in going from one code value to the next code value, i.e., two successive or adjacent code words differ by only one bit. As shown, any arrangement of the columns of the Gray code in table 100 is also a Gray code. Also, any bit inversion of a column or combination of columns is also a Gray code. For any given binary code there can be many Gray code mappings, but all of the other Binary to Gray code mappings can be defined as combinations of bit shifts and bit inversions of the traditional Gray code. Going forward, the discussion will be limited to the traditional Gray code mapping knowing that what is discussed applies equally to other Gray code mappings or other appropriate code mappings. In addition, although the examples herein involve hard disk drives, these techniques may be extended to other types of data storage, as well as any other applications that involve Gray codes or other appropriate codes.

For the traditional mapping between the Binary Code and the Gray Code, the map between the Binary Code and the Gray Code can be defined as a function of the Binary Code bits as follows:

Gray Code $bit_n$=(Binary Code $bit_{n+1}$+Binary Code $bit_n$)Modulo 2 for all bits except the Most Significant Bit (MSB)

Gray Code $bit_n$=Binary Code $bit_n$ for the MSB

The Modulo 2 operation is the equivalent to a logic Exclusive OR operation. FIG. 2 illustrates the logic for a four bit Binary Code to Gray Code map. Although system 200 only shows logic for 4 bits, the logic can be expanded to any number of bits by adding more exclusive OR gates. For the purposes of further discussion the logic shown in system 200 will be referred to as a Gray Encoder. In particular the Gray Encoder shown in system 200 will be referred to as a 4 bit Gray Encoder and similar logic for N bits will be call an N bit Gray Encoder where N is the number of bits. A Gray Encoder without bit designation will refer to a generic Gray Encoder.

Using the designations from system 200, an N bit Gray Encoder can be defined as follows:

$$G[x]=J[x]\oplus J[x+1], \text{ where } 0 \le x \le N-2$$

$$G[x]=J[x], \text{ where } x=N-1$$

The $\oplus$ symbol represents an exclusive OR operation.

A hard disk drive includes a spinning disk with a read/write head positioned above the disk. The disk includes a plurality of concentric tracks. The read/write head can move to different tracks of the disk to read/write data to/from the disk. In some embodiments, the track identifiers are Gray coded. Consecutive tracks have IDs that are consecutive Gray code words. For example, the track IDs may count up from the inner diameter (ID) to the outer diameter (OD). For example, using table 100, the smallest diameter track is 0000, the second smallest diameter track is 0001, the third smallest diameter track is 0011, the fourth smallest diameter track is 0010, etc. In most cases, the head position will only stray off track by less than one track distance. Therefore, in most cases, by Gray coding the track IDs in this manner, the track ID that is read will differ from the expected track ID by at most one Gray code word. As such, if the track ID that is read differs from the expected track ID by more than Gray code word, it is most likely a disk defect. If the track ID that is read differs from the expected track ID by one Gray code word, it is most likely the head position that needs to be adjusted (which can be performed by servo firmware). Therefore, what would be useful is a mechanism for determining whether the track ID that is read (i.e., the read or received Gray code word) differs from the expected track ID (i.e., the expected Gray code word) by more than one Gray code word. More generally, it would be desirable to have a technique to determine if this difference is greater than M Gray code words (where M is an integer), as more fully described below.

In some embodiments, this technique may be accomplished using a look up table that indicates which bit changes when going from code word N to N+1. That bit can be considered an "allowable bit change" as the head reads the track IDs along a desired track N. In some embodiments, as long as the difference between the read track ID and the desired track ID is 0 or an allowable bit change, then it is concluded that the head is within +1 track of the desired track (and the servo system can correct the drift, if any). Otherwise, it is concluded that there is a disk defect, because it is unlikely that the head jumped more than +1 track. In some embodiments, the allowable bit changes also include the bits that change when going from code word N to N−1, e.g., if the head is equally likely to stray up one track as down one track. In this case, there would be 2 allowable bit changes for each code word. For example, if the desired track ID is 00001, then the head may drift either down to track ID 00000 or up to track ID 00011, which corresponds to allowable bit changes 00011 (since the first LSB, or the first and second LSBs may change). The bits that change are designated with a "1" and the bits that do not change are designated with a "0". Note that if the head reads a track ID of 00010, this would fall within the allowable bit changes, and would falsely cause the conclusion to be that the head is within (plus or minus) 1 track; however, to keep the logic circuitry (described below) simple, this is considered acceptable, since the head is still within 2 tracks (i.e., the head hasn't appeared to jump drastically across the disk), and considerable improvement in Gray decoding is still realized. Thus, as used herein, the head is considered approximately 1 code word apart from the expected code word, even though it may occasionally be 2 code words apart.

Another way of looking at the concept is, instead of which bits are allowed to change, which bits are not allowed to change.

In some embodiments, this technique may be accomplished using a look up table that indicates which bits do not change when going from code word N to N+1. That bit can be considered a "disallowed bit change" as the head reads the track IDs. In some embodiments, as long as the read track ID is the same as the desired track ID or the disallowed bit does not change, then it is concluded that the head is close enough to the track of the desired track (and the servo system can correct the drift, if any). Otherwise, it is concluded that there is a disk defect, because it is unlikely that the head jumped so significantly from the desired track. In some embodiments, the disallowed bit changes also take into account the bits that do not change when going from code word N to N−1, e.g., if the head is equally likely to stray up one track as down one track. For example, if the desired track ID is 00001, then the head may drift either down to track ID 00000 or up to track ID 00011, and so the 3 MSBs do not change.

FIG. 3 is a table illustrating which Gray code word bits change in going from code word N to code word N+1. Looking at the "Non-saturated" or "Saturated" output, the bit that changes in going from code word N to code word N+1 is indicated by a 1 (and the other bits are indicated by a 0). For example, when going from the second code word (00001) to the third code word (00011), the non-saturated and saturated output is 00010 because the second LSB changed.

The Non-Saturated Add and the Saturated Add will be more fully described below. The only difference between the Non-Saturated Add and the Saturated Add is in the maximum binary value ((11111) for the 5 bit case), where the MSB is different.

In some embodiments, this look up table may be implemented using a logic function. Such logic is referred to herein as "Delta Gray logic". As used herein, "Delta Gray 1" logic refers to the logic used to determine which Gray code bit changed in going from Gray code word N to N+1. "Delta Gray 2" refers to a logic function that determines which Gray Code bits change in going from Gray code N to N+1 to N+2. "Delta Gray X" refers to a logic function that determines which Gray Code bits change in going from N to N+1 to N+2 to . . . N+X. N and X are integers. In some embodiments, N is associated with the expected code word and X is associated with the approximate number of code words apart the received code word is from the expected code word. For example, if X=2, the received code word could be approximately +2 code words away from the expected code word. Alternatively, if X=2, the received code word could be approximately ±1 code word away from the expected code word, since the logic is similar, as more fully described below.

When referring to a particular bit implementation, it will be referred to as "Y bit Delta Gray", where Y is the number of bits. Although the examples herein may show 4 (or 5) bit examples, the techniques herein can be expanded to any number of bits in various embodiments.

Table 300 and the other tables showing Delta Gray outputs described herein are truth tables for Delta Gray logic. They may be implemented using Delta Gray logic circuitry, which is more fully described below.

Figure 4:
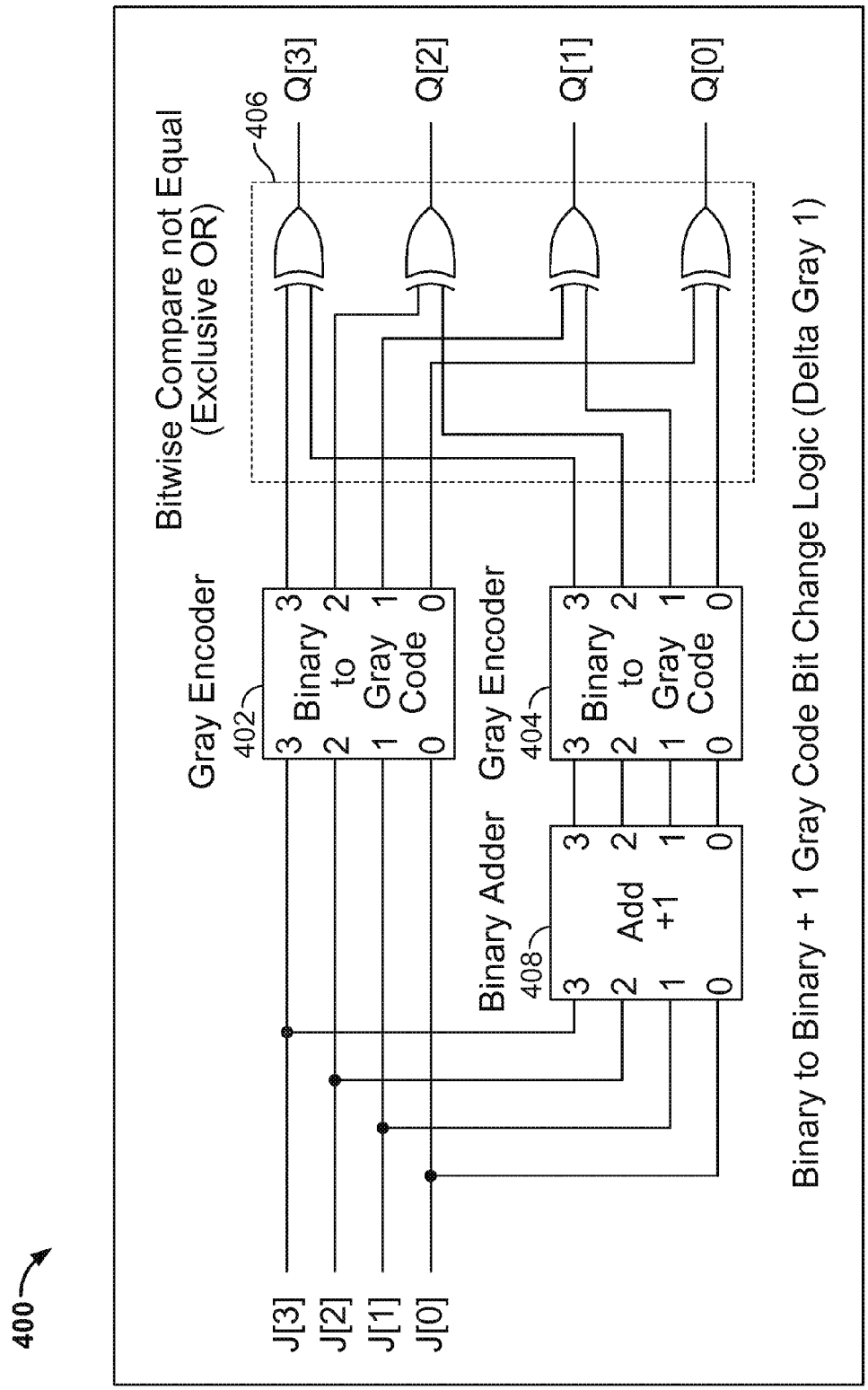
FIG. 4 is a block diagram illustrating an embodiment of Delta Gray 1 logic. Delta Gray 1 logic outputs the Gray code bit that changes in going from Binary Code N to Binary Code N+1.

FIG. 4 is a block diagram illustrating an embodiment of Delta Gray 1 logic. Delta Gray 1 logic outputs the Gray code bit that changes in going from Binary Code N to Binary Code N+1. This can be found by comparing the outputs of two Gray Encoders, where the first Gray Encoder is connected to Binary Code N and the second is connected to Binary code N+1.

In this example, system 400 is shown to include: binary adder 408, Gray encoder 402, Gray encoder 404, and bitwise compare block 406. As shown, binary code word J is input to Gray encoder 402 and to binary adder 408. Binary adder 408 adds 1 to J, and the result is input to Gray encoder 404. Bitwise compare block 406 takes the outputs of Gray encoders 402 and 404 and outputs Q, which indicates which bits change in going from binary code word J to binary code word J+1.

In various embodiments, binary adder 408 may be a non-saturating adder or a saturating adder, depending on the application. A non-saturating adder wraps around, meaning when the maximum binary code is input (1111 for the 4 bit case), the output of the add one operation produces zero (0000). This implies that if the code was at its highest value, when asked to increase it would start back at the beginning A non-saturating adder does not wrap around, meaning when the maximum binary code is input (1111) to the adder the output of the adder is still the maximum value (1111). Both implementations have merit, and the choice for implementation is dependent on the application. For example, disk drive applications may use a saturating adder because the track count does not wrap around after reaching the inner (or outer) most diameter.

In some embodiments, the operation to add 1 could be replaced with an operation to subtract 1. Using this substituted operation as a basis to determine which bit changes in going from one code to the next, a dual basis for logic development could be pursued. The logic would then be for a Binary N to a Binary N−1. With a non-saturating adder, adding −1 to the zero code word (0000) gives the maximum value (1111). With the saturating adder, adding −1 to the zero code word (0000) gives zero (0000). Although implementations in which the adder adds 1 will be discussed herein, in various embodiments, these techniques also apply to implementations that add −1.

Returning to table 300, Delta Gray 1 logic outputs are shown for both the Non-Saturated Add and the Saturated Add. The only difference between the Non-Saturated Add and the Saturated Add is in the maximum binary value ((11111) for the 5 bit case), where the MSB is different.

Figure 5:
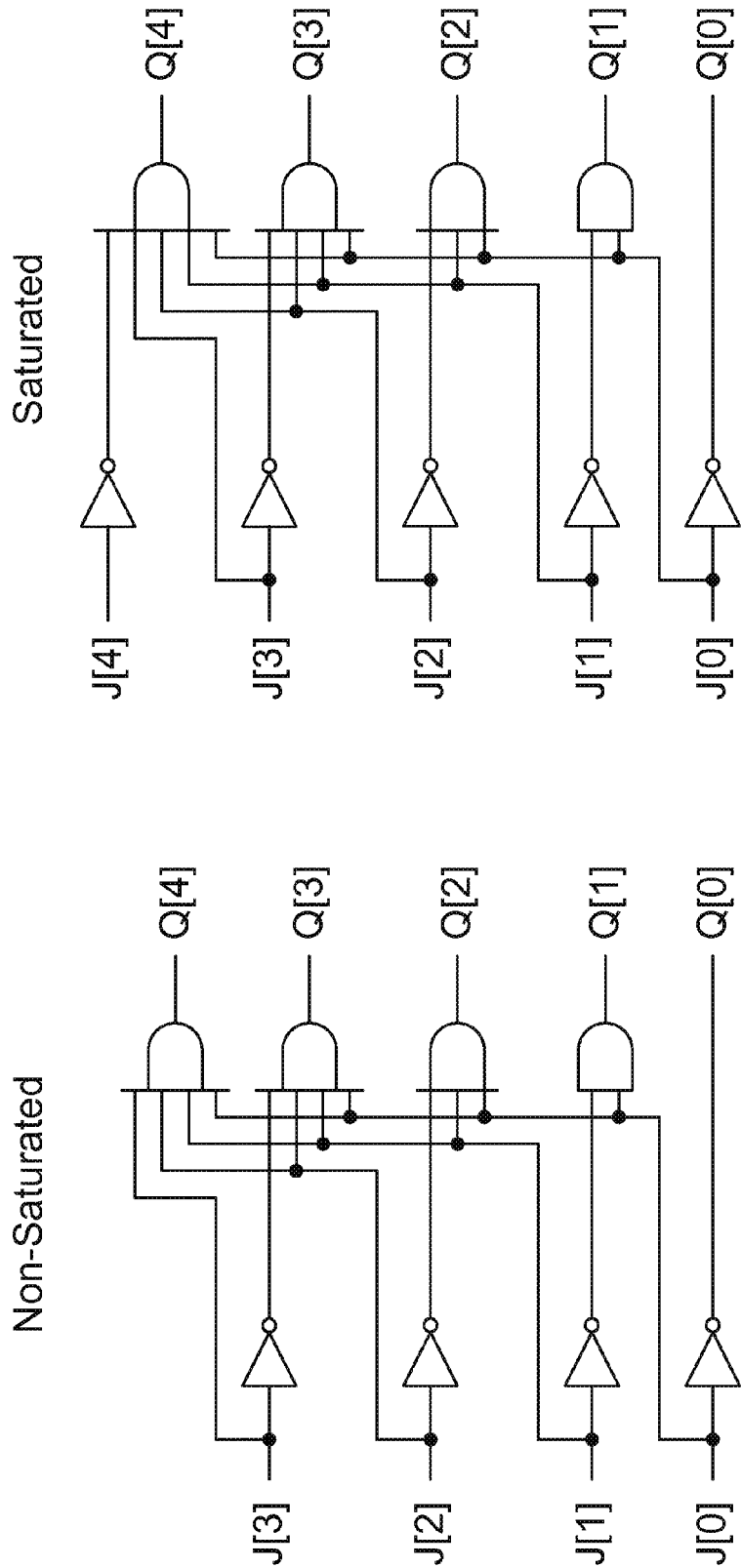
FIG. 5 shows the reduced logic implementation for five bits for both the Non-Saturated and Saturated Add cases.

By analyzing table 300, a significant reduction in the logic shown in system 400 can be achieved. FIG. 5 shows the reduced logic implementation for five bits for both the Non-Saturated and Saturated Add cases. This implementation can be extended to any number of bits.

FIG. 6 is a table illustrating which Gray code word bits change in going from code word N to N+1 to N+2 (Delta Gray 2). For example, when going from the second code word (00001) to the fourth code word (00010), the non-saturated and saturated output is 00011 because the two LSBs changed.

Figure 7:
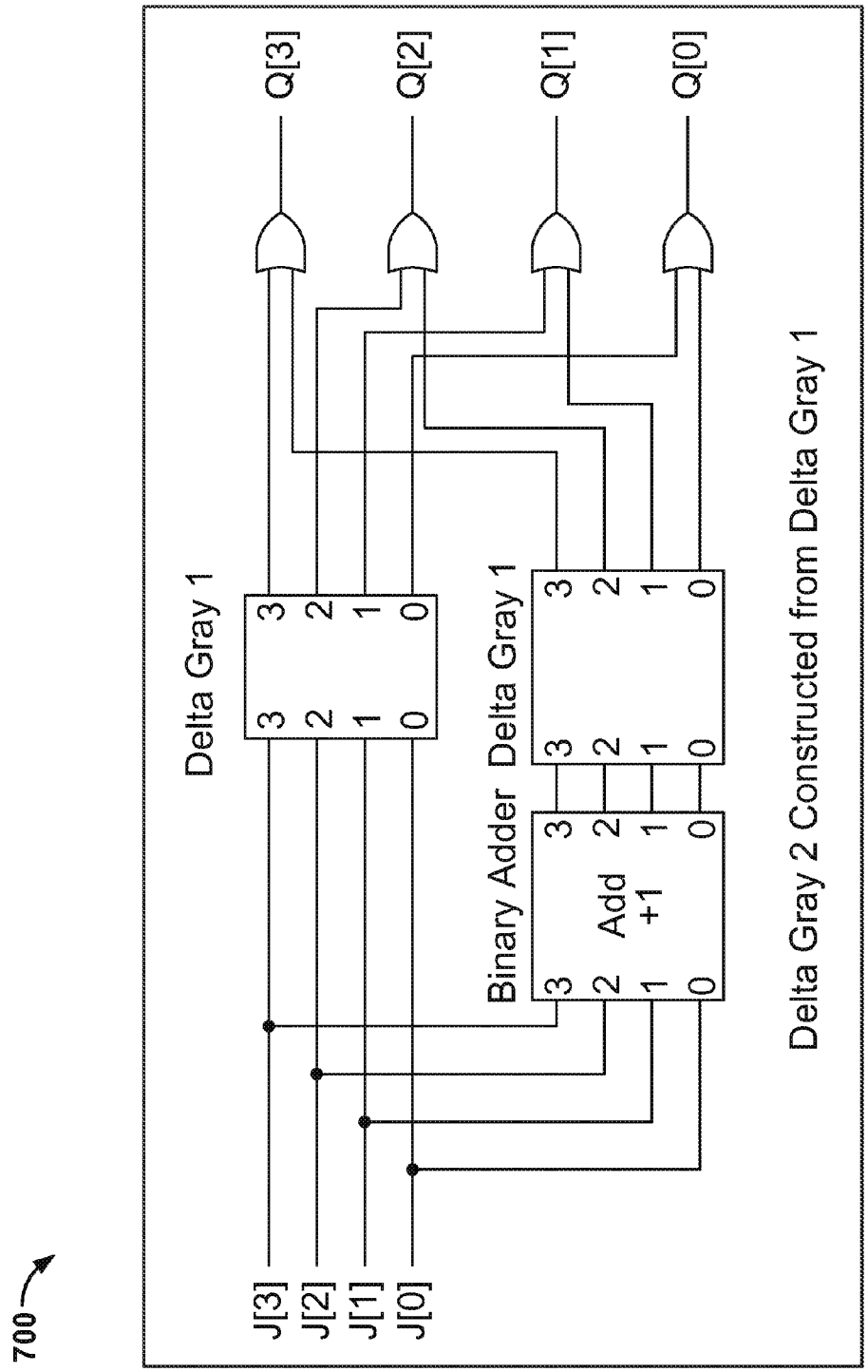
FIG. 7 is a block diagram illustrating an embodiment of Delta Gray 2 logic.

FIG. 7 is a block diagram illustrating an embodiment of Delta Gray 2 logic. Delta Gray 2 logic outputs the Gray code bits that change in going from Binary Code N to N+1 to N+2. Delta Gray 2 logic can be constructed from two Delta Gray 1's an Adder, and some OR Gates. If the Delta Gray 2 is Non-Saturated, then the Delta Gray 1's and the Adder are Non-Saturated. If the Delta Gray 2 is Saturated, then the Delta Gray 1's and the Adder are Saturated.

Figure 8:
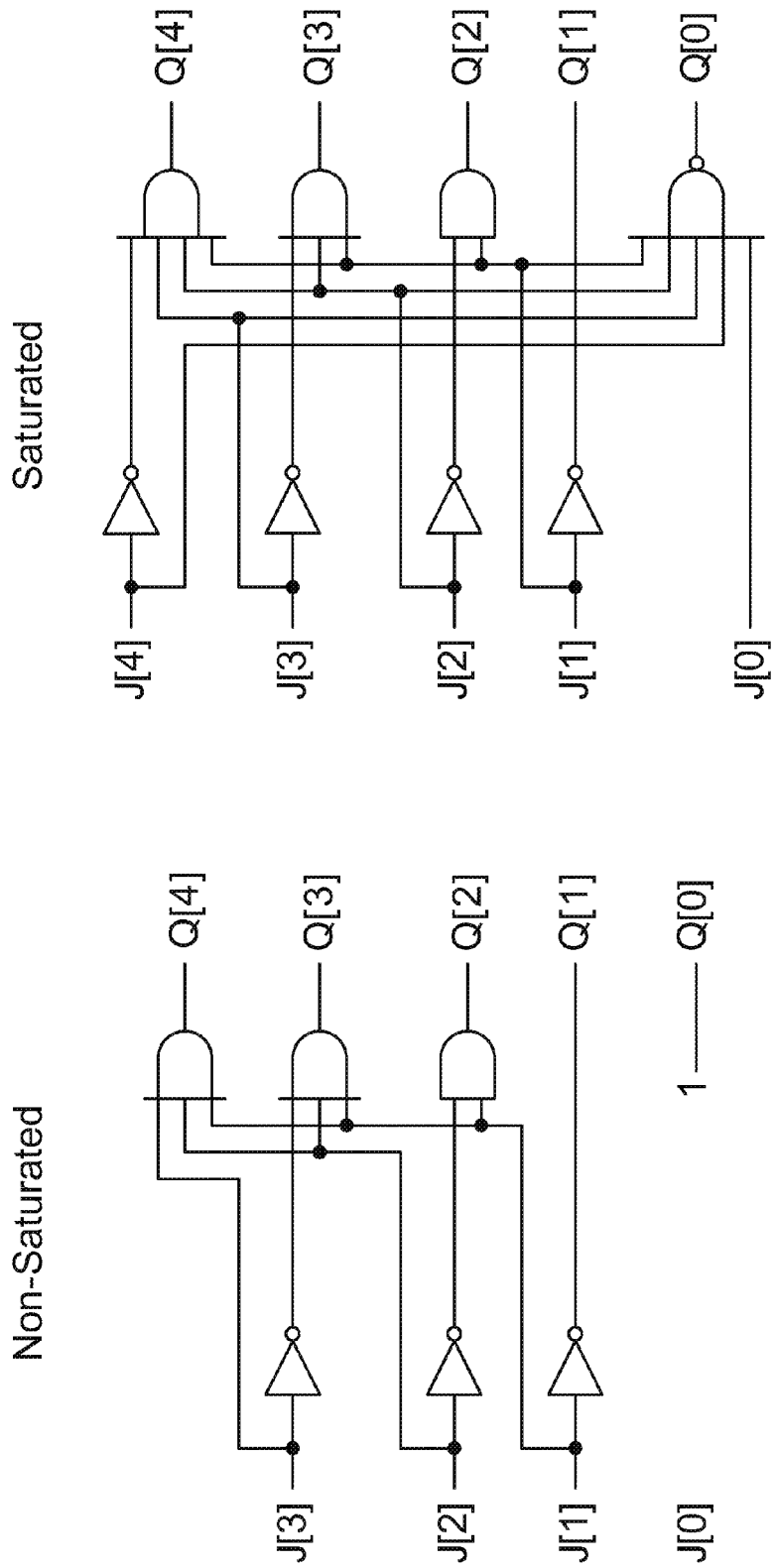
FIG. 8 shows the reduced logic implementation of Delta Gray 2 for five bits for both the Non-Saturated and Saturated Add cases.

By analyzing table 600, a significant reduction in the logic shown in system 700 can be achieved. FIG. 8 shows the reduced logic implementation of Delta Gray 2 for five bits for both the Non-Saturated and Saturated Add cases. This implementation can be extended to any number of bits.

FIG. 9 is a table illustrating which Gray code word bits change in going from code word N to N+1 to N+2 to N+3 (Delta Gray 3). For example, when going from the second code word (00001) to the fifth code word (00110), the non-saturated and saturated output is 00111 because the three LSBs changed.

Figure 10:
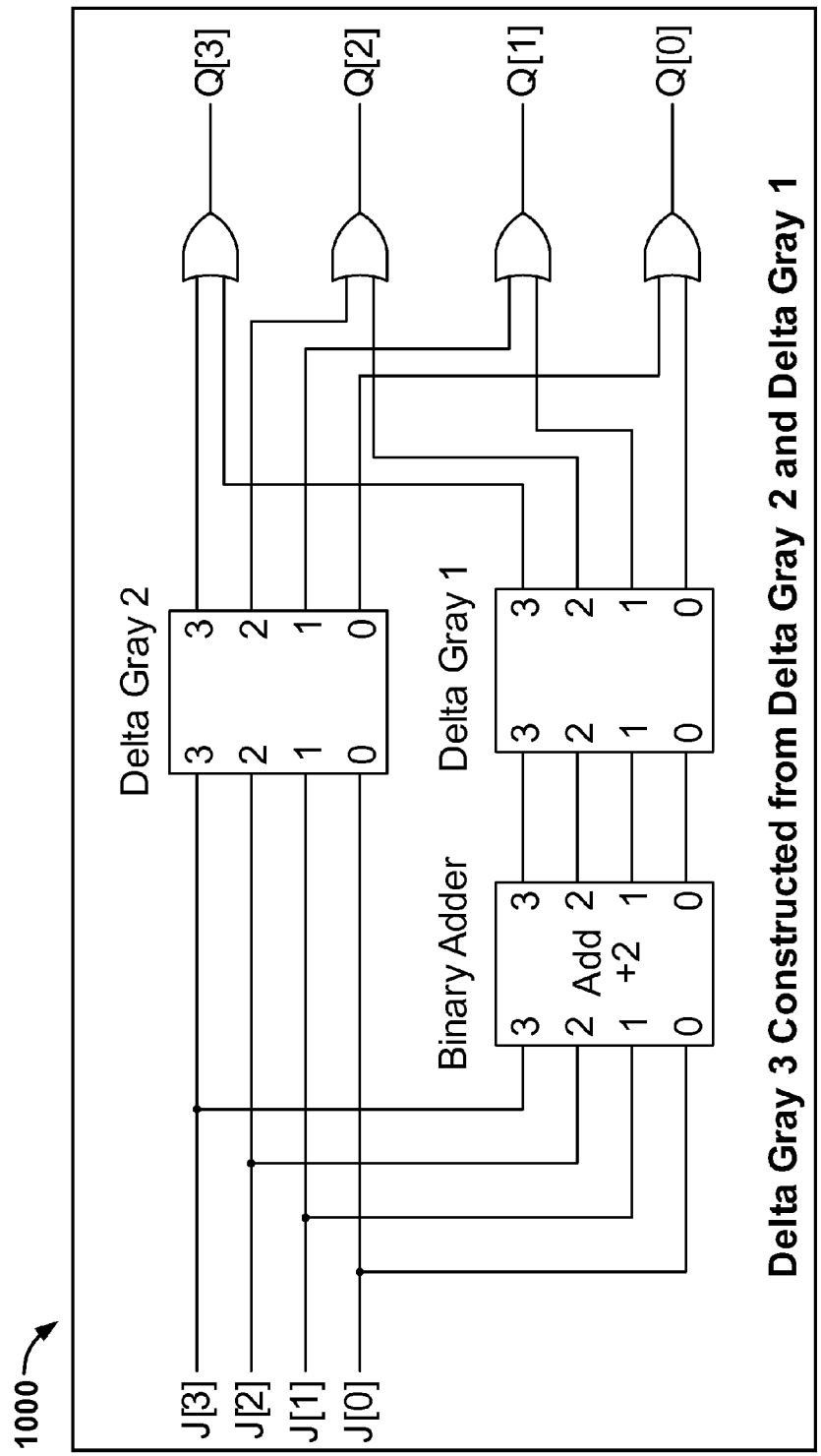
FIG. 10 is a block diagram illustrating an embodiment of Delta Gray 3 logic.

This table can be generated by combining the contents of 300 (Delta Gray 1) and 600 (Delta Gray 2). The contents of the Delta Gray 1 table is shifted by two rows and OR'ed with the contents of the Delta Gray 2 table. FIG. 10 is a block diagram illustrating an embodiment of Delta Gray 3 logic. Non-Saturating Adds and Delta Grays are used for the Non-Saturating Delta Gray 3. Saturating Adds and Delta Grays are used for the Saturating Delta Gray 3.

Figure 11:
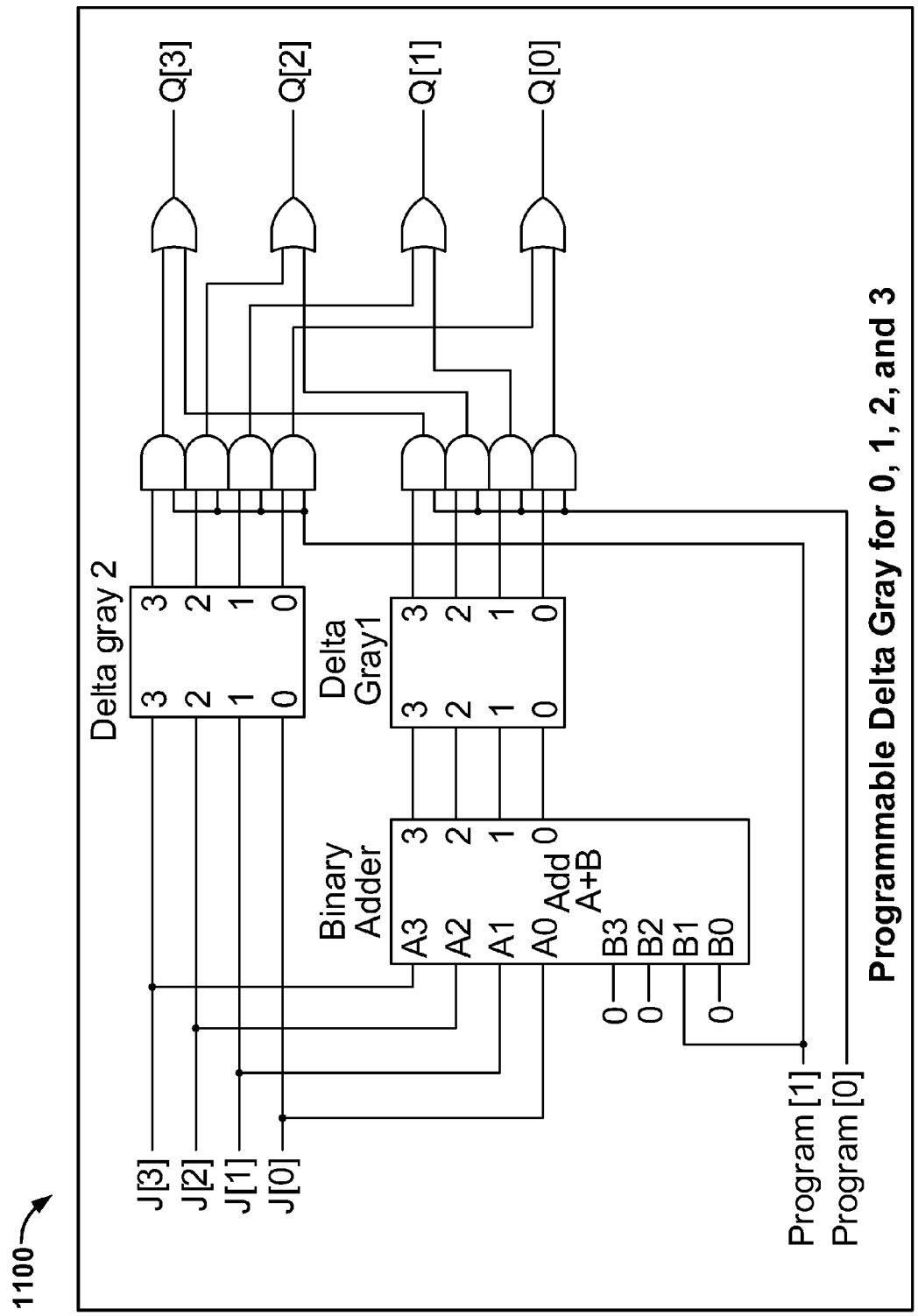
FIG. 11 is a block diagram illustrating an embodiment of Delta Gray 0-3 logic that is programmable.

FIG. 11 is a block diagram illustrating an embodiment of Delta Gray 0-3 logic that is programmable. System 1000 can be modified to be programmable to generate Delta Gray 1, Delta Gray 2, or Delta Gray 3 as shown in system 1100. In system 1100, there are two program bits, Program[1] and Program[0]. The program bits are used to indicate whether Delta Gray 0, 1, 2, or 3 is desired.

Having a programmable Delta Gray may be desirable in cases where Delta Gray 0, 1, 2, or 3 may be desired at different times. For example, when repositioning the read/write head, there may be a greater tolerance for change in the Track ID being read while the read/write head is moving, as more fully described below.

Figure 12:
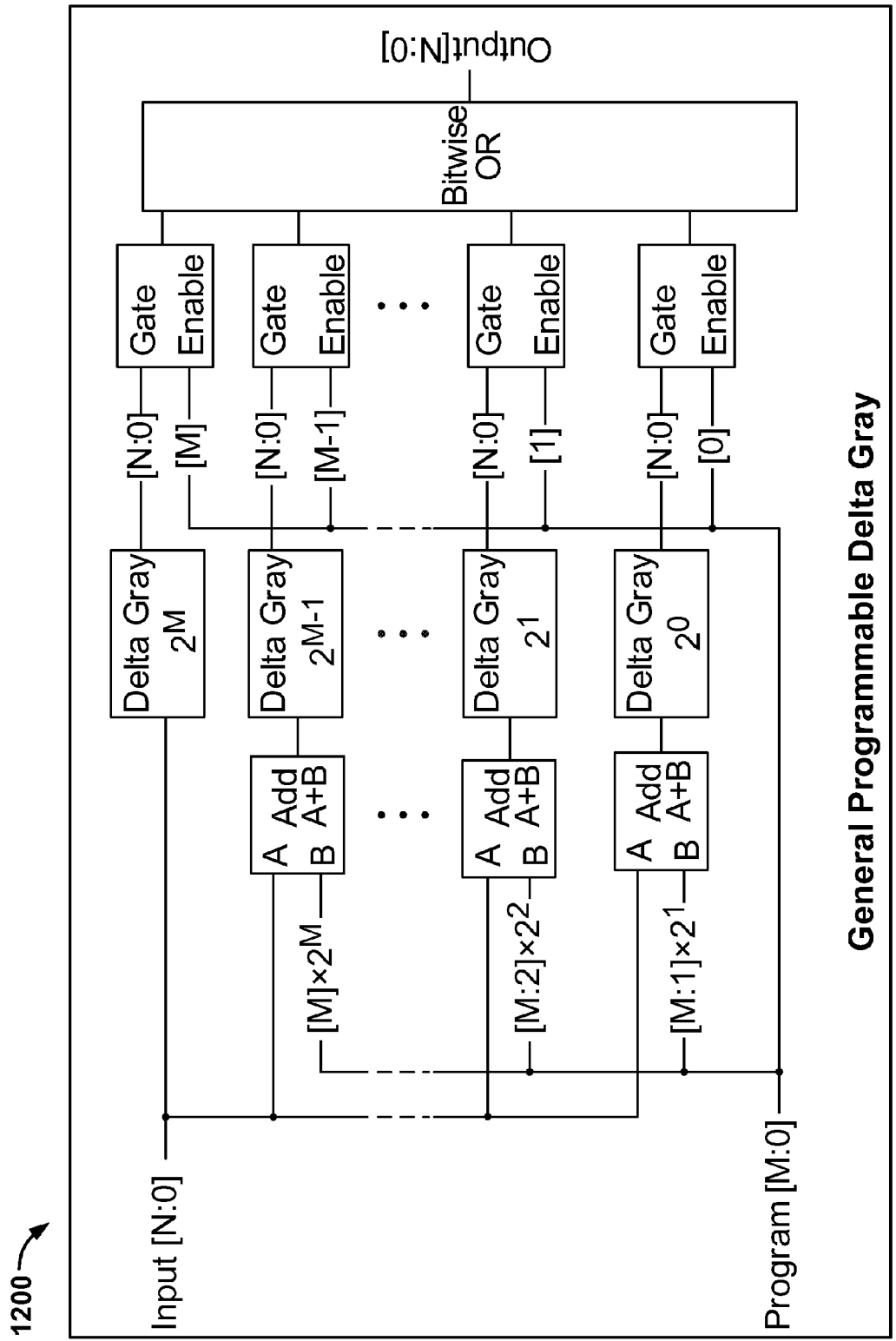
FIG. 12 is a block diagram illustrating an embodiment of a programmable Delta Gray.
Figure 13A:
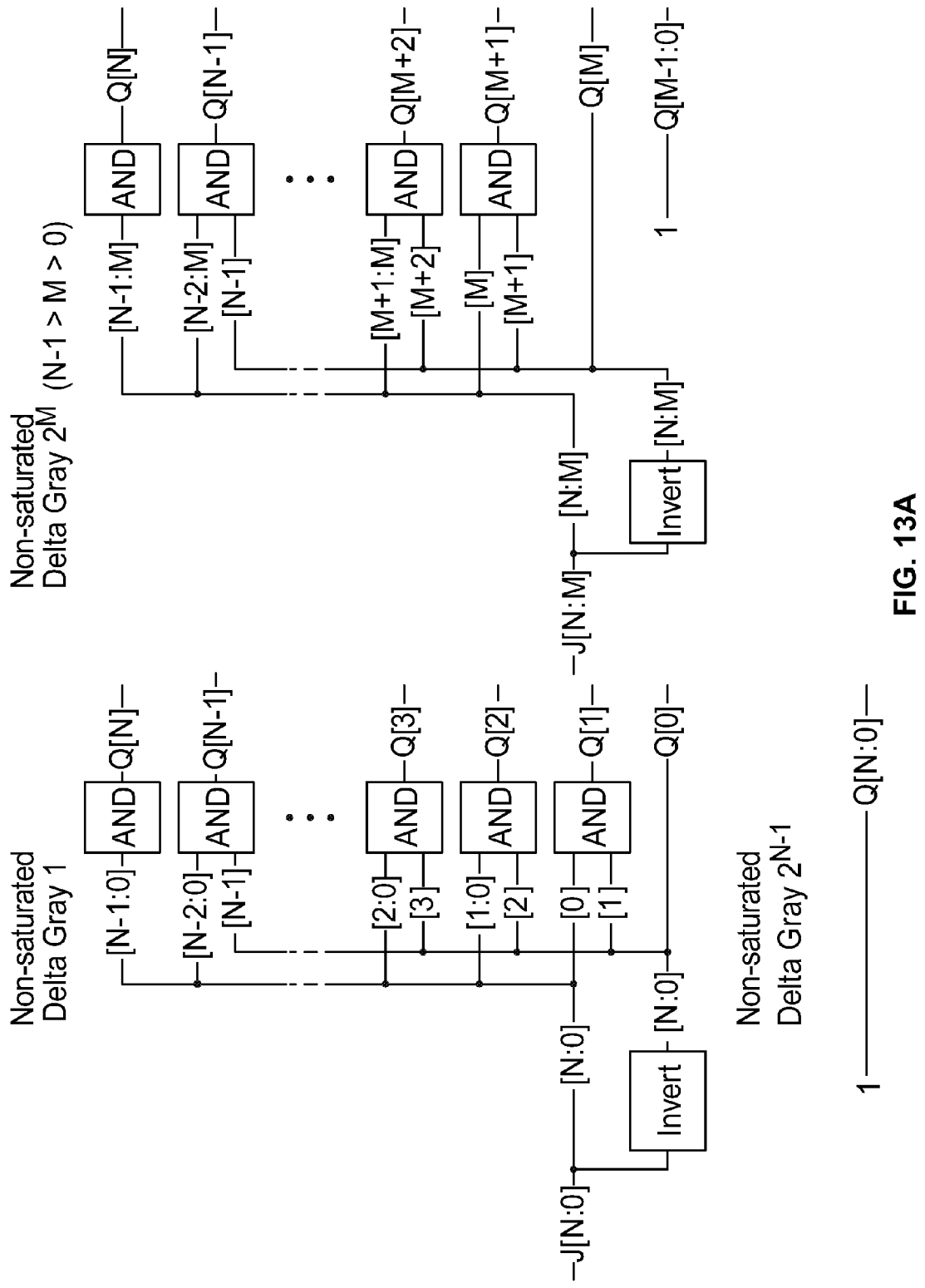
FIG. 13A shows the logic for several fixed Non-Saturating Delta Gray implementations that are power of two.
Figure 13B:
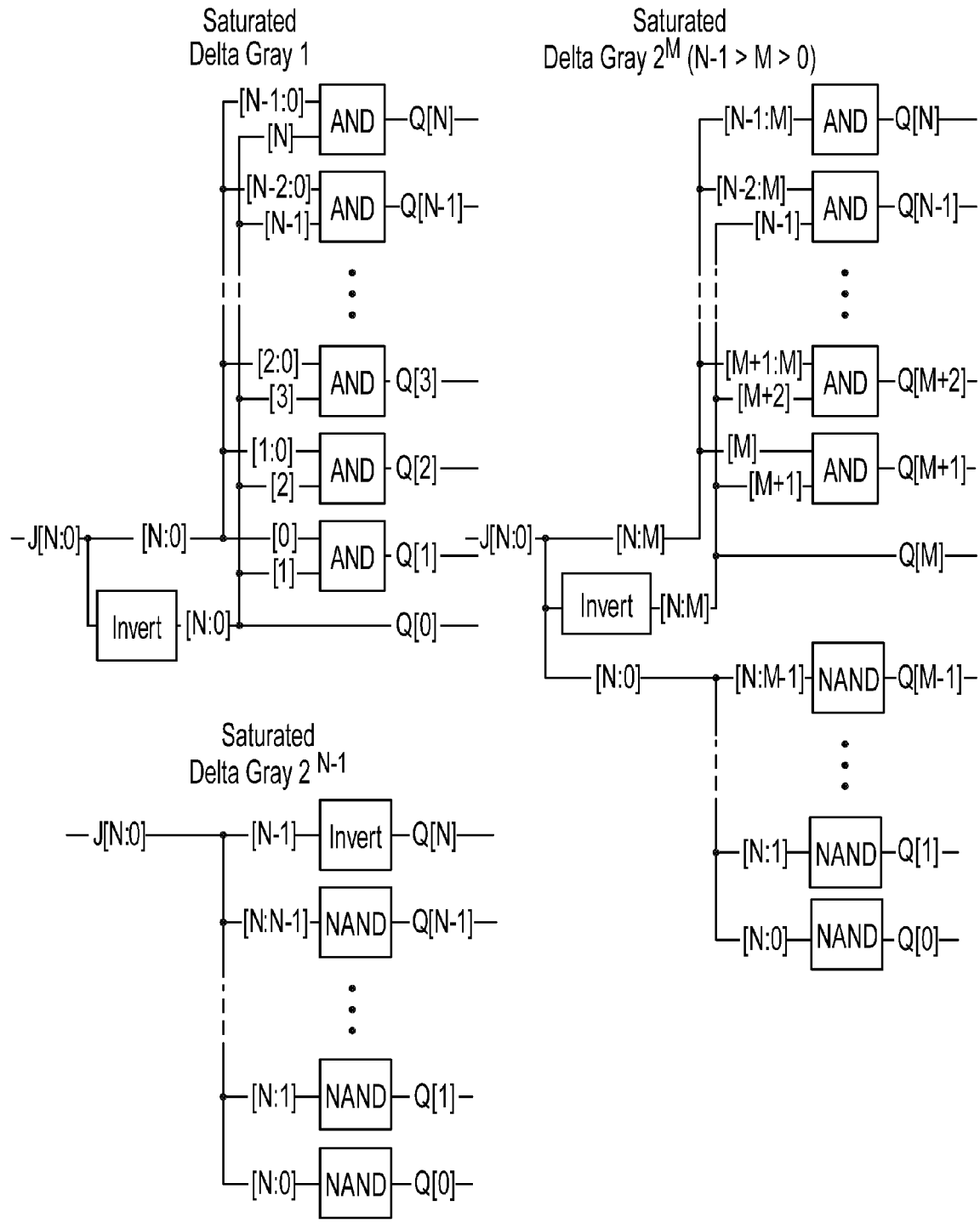
FIG. 13B shows the logic for several fixed Saturating Delta Gray implementations that are power of two.

FIG. 12 is a block diagram illustrating an embodiment of a programmable Delta Gray. This Delta Gray has an N+1 input bus whose bits are labeled N for the MSB, down to 0 for the LSB. The Delta Gray also has a program input, which is an M+1 bit bus whose bits are labeled from M to 0 with M being the MSB and 0 being the LSB. The Program input specifies which Delta Gray count is being generated. For example, a program value of 5 produces a Delta Gray 5. In system 1200, the square brackets indicate a range of bits. For example [X:Y] means bit X of the bus down to bit Y of the bus including all bits in between. A designation such as [M] means just bit M of the bus. This programmable Delta Gray can be Non-Saturating or Saturating. For a Non-Saturating Delta Gray, both the Adders and the Fixed Delta Grays are Non-Saturating. For a Saturating Delta Gray, both the Adders and the Fixed Delta Grays are Saturating. This programmable Delta Gray uses Fixed Delta Grays that are a power of two to achieve the desired functionality. Fixed Delta Grays that are a power of two have a simple logic structure (See FIGS. 13A-B). In some embodiments, further logic reductions are possible when the components shown in FIG. 13A-13B are combined. It is also possible to make the Non-Saturating/Saturating attribute programmable with a few additional gates. In addition, the lower parts of the structure can be removed to make the programming more granular. For example, the Delta Gray $2^0$ can be removed to make a programmable Delta Gray that only goes in increments of two.

FIG. 13A shows the logic for several fixed Non-Saturating Delta Gray implementations that are power of two. All of these implementations are composed of simple logic inverters plus AND gates. FIG. 13A has the inputs on the left and outputs on the right. The input is an (N+1) bit binary value (J) which when Gray Coded using traditional methods would yield a Gray Code value (G). The input bits (J) have the Most Significant Bit (MSB) labeled N and the Least Significant Bit (LSB) labeled 0. The output of the logic (Q) is also an (N+1) bit binary value. The output bits (Q) also have the MSB designated as N and the LSB as 0. The output (Q) has a bit equal to 1 if that changed in going from Gray Code that corresponds to (J) to the Gray Code that corresponds to (J+D), where D is the d in Delta Gray D. The output bit is 1 if any Gray Code corresponding to a value between J and J+D had a bit that changed. For example, a 5 bit Delta Gray 4 could have an input (J) of (00000) corresponding to Gray Code G (00000), then (J+D)=(J+4)=(00100) with corresponding Gray Code G (00110), and the output (Q) would be (00111). The LSB of the output is one because the Gray codes corresponding to (J+1) and (J+2) have changed relative to (J).

For a Non-Saturating Delta Gray greater than or equal $2^{N-1}$, the output (Q) is all ones since every Gray Code bit is changed in going between any two values separated by this much.

FIG. 13B shows the logic for several fixed Saturating Delta Gray implementations that are power of two. All of these implementations are composed of simple logic inverters, AND gates, and NAND gates.

For a Saturating Delta Gray greater than or equal $2^{N-1}$, the output (Q) is the same as shown for Delta Gray 2N–1 since the input is saturated and cannot change any additional bits.

The Programmable Delta Gray described above is based on how many Gray Code bits change in going from one Gray Code to a more positive Gray Code. Therefore, a Delta Gray 1 outputs which bits change in going from code N to N+1. These are the same bits that change in going from N+1 to N. This also applies to Delta Gray M. Therefore, the circuit described can be used for positive and negative Delta Gray generation. Also, going from N to N–1 plus going from N to N+1 is equivalent to going from N–1 to N+1. Therefore the circuit can also be used to generate outputs for N±W, or N+X, –Y, where W, X, and Y are integers. When programming with Saturated Delta Grays, inputs are saturated at zero and the maximum value. As an example, if a Delta Gray is being used as N±1 then when N is 0 then N–1 should also be treated as 0.

In some embodiments, at the input to the Delta Gray logic, there may be additional logic (e.g., shift register, adder) to modify the input to the Delta Gray logic to account for cases in which outputs besides N+X (e.g., outputs for N±W, or N+X, –Y, where W, X, and Y are integers). In embodiments where such outputs are desired, alternatively, it is possible to modify or use different Delta Gray logic, e.g., corresponding to the trust tables corresponding to N±W, or N+X, –Y.

A Programmable Delta Gray can be used to limit the expected responses from a Gray Coded signal stream. In such a signal stream there is a limited difference between the previous received code word and the current received code word. A programmable or fixed Delta Gray could be used to limit the expected bit changes of the received signal. This could be used for error detection or correction, or both. A programmable Delta Gray offers more flexibility in this regard since the range of expected bit changes could be widened or narrowed during operation.

An example of such a Gray Code use is in a disk drive where a Gray Coded track (or cylinder) ID is written to the disk for use by the disk servo system. When the disk servo system is attempting to stay on track, it may read the Gray Coded track ID from two tracks at once, causing single bit uncertainty in the Gray Code value. When the servo system is moving from the current track to another track (track seeking), the Gray Code value could change by many bits from one cylinder ID read to the next. A programmable Delta Gray would allow a narrow range of expected bit changes when the servo system is trying to stay on track and much wider range of expected bit changes when the servo system is moving from one track to another track. The servo firmware has a rough idea of the relative location of the head. For example, when seeking track, a head would initially move slowly, then accelerate to the desired track, and then slow back down when it is close to the desired track. Thus, based on the approximate expected location of the head, the expected track ID and/or delta (X) can dynamically change. For example, delta (X) might be smaller (or larger) during the slow periods than during the fast (acceleration) periods.

There are many other applications for both the fixed and programmable Delta Grays. Although the examples herein described Gray codes, in various embodiments, other types of codes may also be used and corresponding Delta logic can be used.

Figure 14:
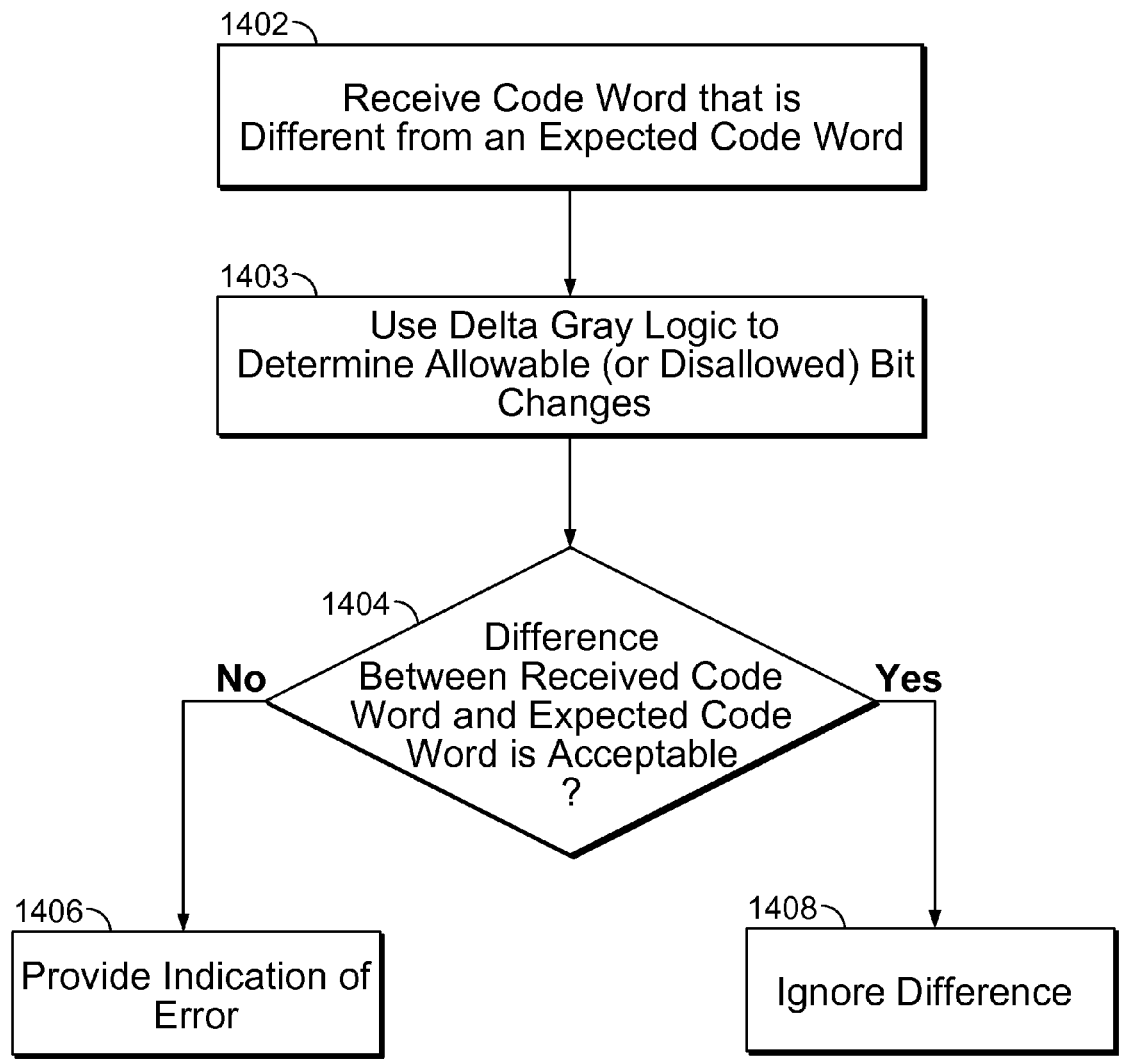
FIG. 14 is a flowchart illustrating an embodiment of processing a received signal.

FIG. 14 is a flowchart illustrating an embodiment of processing a received signal. In some embodiments this process is performed by software, firmware, and/or hardware, e.g., associated with a hard disk drive. In this example, at 1402, a code word is received that is different from an expected code word. In some embodiments, the code word is Gray coded. In some embodiments, receiving the code word comprises reading the code word from a hard disk drive. For example, the code word may be a track ID and the expected code word is a target track ID to be read from or written to. In various embodiments, the expected code word can be associated with any value that is not expected to change much in between receipt (e.g., readings).

At 1403, Delta Gray logic is used to determine allowable (or disallowed) bit changes. Examples of Delta Gray logic are shown in FIGS. 4, 5, 7, 8, 10-12, and 13A-B.

At 1404, it is determined whether the difference between the received code word and the expected code word is acceptable. In some embodiments, the difference comprises the bits that change in going from the received code word N to the expected code word N+X. In some such embodiments, the bits that change include the bits that change in incrementally going from code word N to code word N+X. Incrementally means the bits that change in going from code word N to N+1, from code word N+1 to code word N+2, . . . , and from code word N+X–1 to code word N+X. In other words, the bits that change do not just include the bits that change in going directly from code word N to code word N+X. For example: N=0, X=4, and there are 5 bits. Therefore, code word N is 00000 and code word N+X is 00110. The bits that change when going directly from code word N to code word N+X would be 00110 (i.e., the $2^{nd}$ and $3^{rd}$ LSBs). However, the bits that change when incrementally going from code word N to code word N+X is 00111. The reason is the code words corresponding to N+1 and N+2 change in the LSB relative to 00000. Thus, in such an embodiment, the output from the Delta Gray is 00111.

In some embodiments, the difference comprises the bits that do not change in going from the received code word to the expected code word. In some such embodiments, the difference includes the bits that do not change when going incrementally from code word N to code word N+X.

In some embodiments, at the input to the Delta Gray logic, there may be additional logic (e.g., shift register, adder) to modify the input to the Delta Gray logic to account for cases in which outputs besides N+X (e.g., outputs for N±W, or N+X, –Y, where W, X, and Y are integers). In embodiments where such outputs are desired, alternatively, it is possible to modify or use different Delta Gray logic, e.g., corresponding to the trust tables corresponding to N±W, or N+X, –Y.

If the difference is not acceptable, then at 1406, an indication of error is provided. For example, a defect is flagged for a location associated with the expected track ID. In some embodiments, in addition to flagging a defect, information is sent back to the servo firmware to prevent or abort a write operation prior to starting or before the operation is complete, and then the servo system is notified.

If the difference is acceptable, then at 1408, in some embodiments, the difference is ignored. For example, the read/write head may be slightly off the expected track, and a position error signal is used to correct this.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of processing a received signal, comprising:
receiving a code word that is different from an expected code word;
using a logic circuit to determine whether the difference between the received code word and the expected code word is acceptable, including by:
determining, based at least in part on the received code word, one or more disallowed bit changes, wherein each disallowed bit change corresponds to a bit position which is not expected to change when comparing a desired track's code word against an adjacent track's code word;
determining that the difference is acceptable if (1) the received code word matches the desired track's code word or (2) none of the disallowed bit changes change when comparing the received code word against the adjacent track's code word; and
determining that the difference is unacceptable if one or more disallowed bit changes change when comparing the received code word against the adjacent track's code word; and
in the event it is determined that the difference is unacceptable, providing an indication of an error.

2. The method of claim 1, wherein the received code word is a Gray code word.

3. The method of claim 1, further comprising in the event it is determined that the difference is acceptable, ignoring the difference or continuing as if there was no difference.

4. The method of claim 1, wherein receiving a code word comprises reading a portion of a hard disk drive corresponding to a track ID.

5. The method of claim 1, wherein the logic circuit comprises Delta Gray logic.

6. The method of claim 5, wherein a shift register or adder is used to modify the input to the Delta Gray logic.

7. The method of claim 1, wherein the error comprises a disk drive defect.

8. The method of claim 1, further including, in the event it is determined that the difference is unacceptable, performing error correction.

9. The method of claim 1, further including, in the event it is determined that the difference is unacceptable, aborting a write operation.

10. The method of claim 1, wherein the disallowed bit changes further include a bit position which is not expected to change when comparing the desired track's code word against a code word of a track which is X tracks away from the desired track, where X is an integer.

11. The method of claim 10, wherein X is variable.

12. The method of claim 11, wherein X is smaller when a servo system is trying to stay on track and larger when the servo system is moving from one track to another track.

13. A system for processing a received signal, comprising:
an input interface configured to receive a code word that is different from an expected code word;
a logic circuit configured to determine whether the difference between the received code word and the expected code word is acceptable, including by:
determining, based at least in part on the received code word, one or more disallowed bit changes, wherein each disallowed bit change corresponds to a bit position which is not expected to change when comparing a desired track's code word against an adjacent track's code word;
determining that the difference is acceptable if (1) the received code word matches the desired track's code word or (2) none of the disallowed bit changes change when comparing the received code word against the adjacent track's code word; and
determining that the difference is unacceptable if one or more disallowed bit changes change when comparing the received code word against the adjacent track's code word; and
an output interface configured to provide an indication of an error in the event it is determined that the difference is unacceptable.

14. The system of claim 13, wherein the disallowed bit changes further include a bit position which is not expected to change when comparing the desired track's code word against a code word of a track which is X tracks away from the desired track, where X is an integer.

15. The system of claim 14, wherein X is variable.

16. The system of claim 15, wherein X is smaller when a servo system is trying to stay on track and larger when the servo system is moving from one track to another track.

17. A computer program product for processing a received signal, the computer program product being embodied in a non-transitory computer readable storage medium and comprising computer instructions for:
receiving a code word that is different from an expected code word;
determining whether the difference between the received code word and the expected code word is acceptable, including by:
determining, based at least in part on the received code word, one or more disallowed bit changes, wherein each disallowed bit change corresponds to a bit position which is not expected to change when comparing a desired track's code word against an adjacent track's code word;
determining that the difference is acceptable if (1) the received code word matches the desired track's code word or (2) none of the disallowed bit changes change when comparing the received code word against the adjacent track's code word; and
determining that the difference is unacceptable if one or more disallowed bit changes change when comparing the received code word against the adjacent track's code word; and
in the event it is determined that the difference is unacceptable, providing an indication of an error.

18. The computer program product of claim 17, wherein the disallowed bit changes further include a bit position which is not expected to change when comparing the desired track's code word against a code word of a track which is X tracks away from the desired track, where X is an integer.

19. The computer program product of claim 18, wherein X is variable.

20. The computer program product of claim 19, wherein X is smaller when a servo system is trying to stay on track and larger when the servo system is moving from one track to another track.

* * * * *